US007877672B2

(12) United States Patent
Dobson

(10) Patent No.: US 7,877,672 B2
(45) Date of Patent: Jan. 25, 2011

(54) SYSTEM AND METHOD FOR PERFORMING REED-SOLOMON ENCODING

(75) Inventor: Timothy Dobson, Cambridge (GB)

(73) Assignee: Broadcom Corporation, Irvine, CA (US)

( * ) Notice: Subject to any disclaimer, the term of this patent is extended or adjusted under 35 U.S.C. 154(b) by 1072 days.

(21) Appl. No.: 11/549,798

(22) Filed: Oct. 16, 2006

(65) Prior Publication Data

US 2008/0092021 A1 Apr. 17, 2008

(51) Int. Cl.
*H03M 13/00* (2006.01)
(52) U.S. Cl. .................. 714/784; 714/752; 714/758
(58) Field of Classification Search .................. 714/752, 714/757, 758, 784
See application file for complete search history.

(56) References Cited

U.S. PATENT DOCUMENTS

| 6,353,909 | B1 * | 3/2002 | Amrany et al. ............... 714/757 |
| 2008/0126908 | A1 * | 5/2008 | Lin ............................. 714/758 |

OTHER PUBLICATIONS

Stephen B. Wicker and Vijay K. Bhargava, An Introduction to Reed-Solomon Codes, in Reed-Solomon Codes and Their Applications, 1-16, (Stephen B. Wicker and Vijay K. Bhargava eds.), New York, NY, 1994.

* cited by examiner

*Primary Examiner*—Sam Rizk
(74) *Attorney, Agent, or Firm*—Sterne, Kessler, Goldstein & Fox P.L.L.C.

(57) ABSTRACT

An embodiment of the present invention provides a system for implementing a Reed-Solomon computation of parity bytes of a codeword, including an accumulator and a logic circuit. The accumulator is configured to hold a plurality of bits. In an embodiment, each bit held in the accumulator initially corresponds to a bit associated with a data byte of the codeword. In another embodiment, each bit held in the accumulator initially correspond to a fixed value. The logic circuit is configured to iteratively compute a new bit for each bit held in the accumulator. After a last iteration of the computation, the bits held in the accumulator correspond to the parity bytes, wherein for each bit held in the accumulator each iteration of the computation comprises computing an exclusive-OR of a fixed subset of bits held in the accumulator. In an embodiment, the exclusive-OR is computed for the fixed subset of bits held in the accumulator and an input bit of the codeword.

23 Claims, 4 Drawing Sheets

SYSTEM AND METHOD FOR PERFORMING REED-SOLOMON ENCODING

BACKGROUND OF THE INVENTION

1. Field of the Invention

The present invention is generally directed to encoding, and more particularly to implementations of Reed-Solomon encoding.

2. Background

Errors can occur in the transmission or storage of data. Reed-Solomon (RS) encoding is a well-known error correction encoding scheme that can be used to correct such errors. An RS encoder computes redundant bits, called parity bytes, from the data that is to be transmitted or stored. The parity bytes are then concatenated with the data bytes. The concatenation of the parity bytes and the data bytes is referred to as a codeword. The redundant parity bits included in the codeword can be used by an RS decoder to correct for errors that occur during transmission or storage.

A popular RS code provides a codeword containing 255 bytes, with 8-bit symbols. Of the 255 bytes in the codeword, 223 bytes are data bytes and 32 bytes are parity bytes. Using such an RS code, an RS decoder can correct errors in up to 16 bytes per codeword. In general, for a codeword including K data bytes and R parity bytes, an RS decoder can correct errors in up to R/2 bytes per codeword.

The parity bytes of a codeword are computed by performing various calculations based on mathematical operations in a Galois field. A Galois field is a "finite field," or more generally a "field," as studied in the branch of mathematics known as abstract algebra. Conceptually, the Galois field computation scheme can be understood by representing the data symbols of the codeword as coefficients of a polynomial. Using the properties of polynomial multiplication and division, the parity bytes can be computed from both the polynomial representing the data bytes and a primitive polynomial of the Galois field.

While this computation scheme can result in an effective error correction code, the computation of the RS parity bytes is relatively complex. As a result of this complexity, an RS encoder may require complex circuitry, and therefore may be prohibitively costly to manufacture. In addition, the RS encoding scheme may require complex algorithms to implement, and therefore may be too slow for current applications.

Given the foregoing, what is needed is a system and method for performing optimized RS encoding in a microprocessor. Such a system and method should be able to compute a fixed number of RS parity bytes that are commonly used in RS codes and a programmable number of RS parity bytes.

BRIEF SUMMARY OF THE INVENTION

In accordance with the present invention there is provided a system and method for performing optimized RS encoding. This optimized RS encoding scheme can be used to compute a fixed number of RS parity bytes that are commonly used in RS codes and a programmable number of RS parity bytes.

An embodiment of the present invention provides a system for implementing an RS computation of parity bytes of a codeword. The system includes an accumulator and a logic circuit. The accumulator is configured to hold a plurality of bits. In an embodiment, the bits in the accumulator are initialized to zero. In an alternative embodiment, each bit held in the accumulator initially corresponds to a bit associated with a data byte of the codeword. The logic circuit is configured to iteratively compute a new bit for each bit held in the accumulator. After a last iteration of the computation, the bits held in the accumulator correspond to the parity bytes, wherein for each bit held in the accumulator each iteration of the computation comprises computing an exclusive-OR of a fixed subset of bits held in the accumulator. In an embodiment, the exclusive-OR computation is performed on the fixed subset of bits held in the accumulator and an input bit of the codeword.

Another embodiment of the present invention provides a method for implementing an RS computation of parity bytes of a codeword. The method includes the following steps: holding a plurality of bits in an accumulator, wherein each bit held in the accumulator is initialized to zero or corresponds to a data bit associated with a data byte of the codeword; computing a new bit for each bit held in the accumulator by performing for each bit an exclusive-OR of a fixed subset of the bits held in the accumulator; and repeating the computing step a plurality of times, such that after a last repetition the bits held in the accumulator correspond to the parity bytes. In an embodiment, the exclusive-OR is performed for the fixed subset of bits and an input bit of the codeword.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
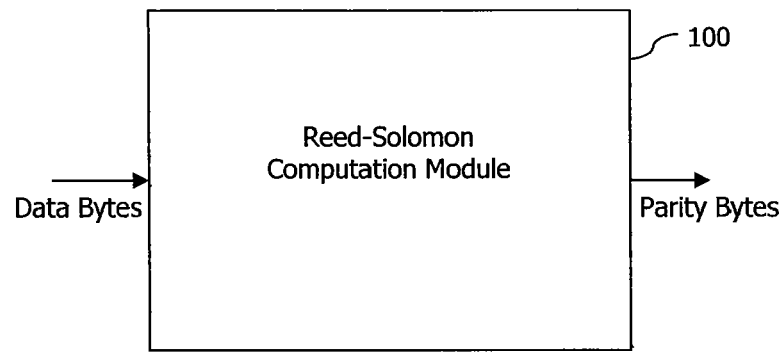
FIG. 1 depicts a block-diagram of a module for computing Reed-Solomon parity bytes in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

I. Overview

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the relevant art(s) to effect such feature, structure, or characteristic in connection with other embodiments whether or not explicitly described.

In what follows, an embodiment of the present invention is described as it would be implemented in a microprocessor. However, the present invention is not limited to such implementations. For example, as is described below, an embodiment of the present invention can be implemented in software, hardware, firmware, or a combination thereof.

As described in more detail herein, an embodiment of the present invention provides a system and method for computing Reed-Solomon (RS) parity bytes of a codeword. For example, FIG. 1 depicts a block-diagram illustrating a RS computation module 100 for computing RS parity bytes in accordance with an embodiment of the present invention. Data bytes of a codeword are input into RS computation module 100, which then produces the RS parity bytes as output. Compared to conventional systems and methods, an embodiment of the present invention computes RS parity bytes more efficiently by using a linearity property of Galois field multiplication and addition, which is described below.

Figure 2:
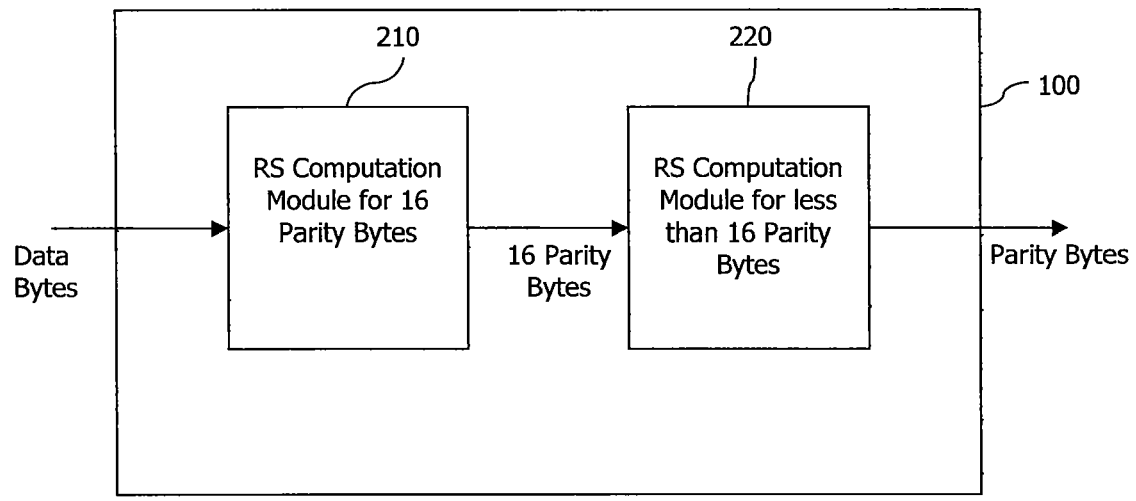
FIG. 2 depicts the module of FIG. 1 comprising two sub-modules for computing Reed-Solomon parity bytes in accordance with an embodiment of the present invention.

The RS parity bytes can be computed in a two-step process. For example, FIG. 2 depicts a block-diagram illustrating an embodiment in which RS computation module 100 includes a first RS computation module 210 and a second RS computation module 220. First RS computation module 210 computes a fixed number of RS parity bytes based on a linearity property of Galois field addition and multiplication. Second RS computation module 220 may optionally compute a programmable number of RS parity bytes responsive to the fixed number of parity bytes computed by first RS computation module 210. As described in more detail below, the RS parity bytes are computed by performing an exclusive-OR on a fixed subset of input data bytes, wherein the fixed subset is determined based on a primitive polynomial of the Galois field.

In an embodiment, first RS computation module 210 operates on data bytes of a codeword to produce a fixed number of 16 parity bytes. In another embodiment, first RS computation module 210 operates on data bytes of a codeword to produce a fixed number of 8 parity bytes. In a further embodiment, first RS computation module 210 may produce either 16 parity bytes or 8 parity bytes depending on a selected mode of operation. The mode of operation may be selected by an extra parameter included in an instruction to a microprocessor, by a configuration register, or by another manner as would be apparent to a person skilled in the relevant art(s).

In an embodiment, the fixed number of parity bytes computed by first RS computation module 210 is produced as output and are not provided to second RS computation module 220. In another embodiment, second RS computation module 220 uses the parity bytes computed by first RS computation module 210 to compute a programmable number of parity bytes based on the above-mentioned linearity property of Galois field addition and multiplication. The programmable number of parity bytes computed by second RS computation module 220 is less than the fixed number of parity bytes computed by first RS computation module 210. For example, the programmable number of parity bytes may be less than 16 parity bytes or less than 8 parity bytes.

While first RS computation module 210 and second RS computation module 220 are shown as distinct components in FIG. 2, it is to be appreciated that this is for illustrative purposes only, and not limitation. For example, these modules could be combined in a single module, these modules could use functionality contained in a shared module, or some other combination or modification of these modules can be realized as would be apparent to a person skilled in the relevant art from reading the description contained herein. It is to be appreciated that these combinations and modifications are contemplated within the scope and spirit of the present invention.

In what follows, specific embodiments of the present invention are described. It is to be appreciated that this is for illustrative purposes only, and not limitation. Based on the embodiments described herein, several generalizations will be apparent to a person skilled in the relevant art(s). It is to be appreciated that these generalizations are contemplated within the spirit and scope of the present invention.

For example, in what follows it is assumed that either 16 parity bytes or 8parity bytes are computed by first RS computation module 210, wherein each byte is 8-bits wide. However, a person skilled in the relevant art(s) will understand how to effect modifications to handle a larger or smaller number of parity bytes by reading the description contained herein.

In addition, the below-described equations used to compute these parity bytes are based on the primitive polynomial $\alpha^8 + \alpha^4 + \alpha^3 + \alpha^2 + \alpha^0$ (which is a commonly-used polynomial for 8-bit RS codes). However, the same principles described below would apply to other 8-bit primitive polynomials, or indeed to other primitive polynomials of other orders, so the data words comprising the RS codeword need not be 8 bits wide.

Furthermore, in what is described below, examples are presented in which first RS computation module 210 operates on groups of 16 data words or groups of 8 data words. However, these examples are presented for illustrative purposes only, and not limitation. Based on the description contained herein, a person skilled in the relevant art(s) will understand how to utilize the present invention to operate on larger or smaller groups of data.

For example, a whole codeword could be processed in one operation. In this example, to compute an 8-bit, 16-parity byte version of the RS parity bytes, would involve 128 output bits, each of which is the exclusive-OR of a subset of 2040 input bits. As another example, the size of each input group that is processed can be reduced. Such a reduction, however, includes performing each operation more times.

The mathematical motivation for splitting the computation of the RS parity bytes between first RS computation module 210 (which computes a fixed number of parity bytes) and second RS computation module 220 (which computes a programmable number of parity bytes) is now given. As is well-known, an RS codeword comprises data bytes and parity bytes. For an RS codeword of K data bytes and R parity bytes, the total number of bytes included in the RS codeword is N=K+R, where N, K, and R are positive integers. The bytes of the RS codeword can be associated with the coefficients of a polynomial t(x) given by $$t(x) = \sum_{i=0}^{255} t_i x^{255-i}. \quad (1)$$

The coefficients of $t(x)$ are represented as $$t_i = \begin{cases} 0, & i = 0, \ldots, (255-N); \\ d_{i-(256-N)}, & i = (256-N), \ldots, (255-R); \\ P_{i-(256-R)}, & i = (256-R), \ldots, 255. \end{cases} \quad (2)$$

where $d_0, d_1, \ldots, d_{K-1}$ are the K data bytes and $P_0, P_1, \ldots, P_{R-1}$ are the R parity bytes. The $d_{i-(256-N)}$ and the $P_{i-(256-R)}$ are related by Galois field addition and multiplication.

This mathematical relationship is now expressed. Let $t(x)$ be given by equation (1) and let polynomials $g(x)$, $p(x)$, and $u(x)$ be given by the following equations:

$$g(x) = \prod_{i=1}^{R} (x + \alpha^i) \quad (3)$$

$$p(x) = \sum_{i=0}^{R-1} P_i x^{R-1-i} \quad (4)$$

$$u(x) = t(x) \bmod g(x) = \sum_{i=0}^{R-1} u_i x^{R-1-i}. \quad (5)$$

Then, demanding that $u(x)=0$ for all x ensures that the parity bytes are related to the data bytes in a known way. That is, given the data bytes of a codeword (i.e., the coefficients $d_{i-(256-N)}$), the parity bytes of the codeword (i.e., the coefficients $P_{i-(256-R)}$) can be calculated by computing the polynomial $u(x)$ that satisfies equation (5) with the additional condition that $u(x)=0$ for all x.

The computation of the polynomial $u(x)$, and therefore the parity bytes of the RS codeword, can be split into two separate computations. In a first computation, a polynomial that includes a fixed number of n parity bytes (such as, 16 parity bytes or 8 parity bytes) can be computed, rather than a polynomial that includes a programmable number of parity bytes. That is, the computation of the polynomial $u(x)$ is based on the polynomial $g(x)$, which is of order R, where R is a positive integer that represents a programmable or variable number of parity bytes. Instead of computing $u(x)$ in a single computation, a polynomial $U(x)$ can be computed, given by $$U(x) = t(x) \bmod G(x), \quad (6)$$

wherein $G(x)$ is a polynomial of order n given by $$G(x) = \prod_{i=1}^{n} (x + \alpha^i). \quad (7)$$

The computation of $U(x)$ is based on a polynomial $G(x)$ of fixed order—namely, of order n.

In a second computation, the polynomial $u(x)$ can be computed from the polynomial $U(x)$. In particular, because the polynomial $g(x)$ divides the polynomial $G(x)$, the polynomial $u(x)$ can be computed as follows:

$$u(x) = t(x) \bmod g(x)$$
$$= (t(x) \bmod G(x)) \bmod g(x)$$
$$= U(x) \bmod g(x)$$

First RS computation module 210 is configured to compute the polynomial $U(x)$, which does not depend on a programmable number of parity bytes. In an embodiment, the fixed number of n parity bytes is 16 parity bytes. In another embodiment, the above-described equations may be modified, so that the fixed number of n parity bytes is 8 parity bytes. Second RS computation module 220 is configured to compute the polynomial $u(x)$, given by $u(x)=U(x) \bmod g(x)$. In other words, second RS computation module 220 is configured to compute the programmable number of parity bytes from the polynomial $u(x)$.

The description that follows is divided into four subsections—section II, section III, section IV, and section V. In section II, the functionality of first RS computation module 210 is described. That is, the computation of a fixed number of parity bytes is described. This description includes mathematical details explaining how the linearity property of Galois field multiplication and addition is implemented in first RS computation module 210. In section III, the functionality of second RS computation module 220 is described, which also includes mathematical details of the Galois field multiplication and addition. In section IV, an example method for computing RS parity bytes in accordance with an embodiment of the present invention is described. In section V, an example computer system is described, wherein the computer system may execute an embodiment of the present invention.

II. Computation of a Fixed Number of Parity Bytes

As mentioned above, first RS computation module 210 computes a fixed number of RS parity bytes. In an embodiment the fixed number of bytes is 16 RS parity bytes. In another embodiment, the fixed number of bytes is 8 RS parity bytes. In the 16 RS parity bytes embodiment, the 16 bytes may be fed into first RS computation module 210 16 bytes at a time or may be fed into first RS computation module 210 8-bytes at a time. Each of these embodiments is described in more detail below, but first an overview of an example embodiment of first RS computation module 210 is provided.

Figure 3:
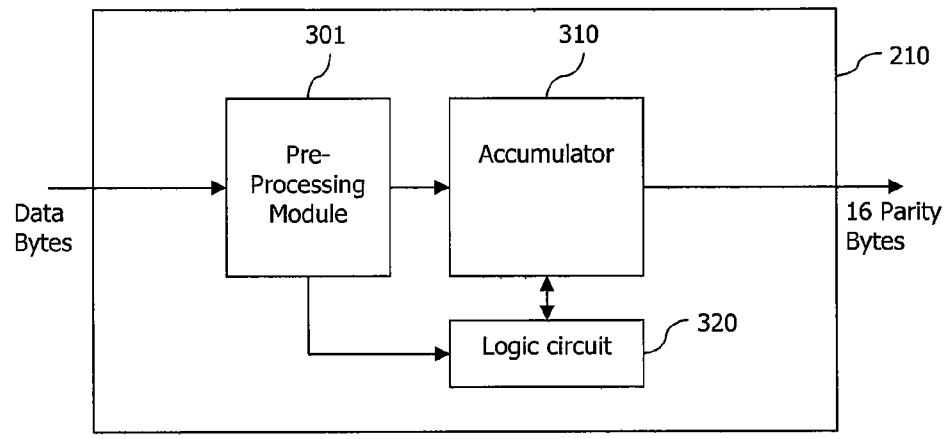
FIG. 3 illustrates a first of the sub-modules of FIG. 2 for computing Reed-Solomon parity bytes in accordance with an embodiment of the present invention.

A. Example Details of First RS Computation Module 210 in Accordance With an Embodiment of the Present Invention FIG. 3 illustrates an embodiment of first RS computation module 210 which includes a pre-processing module 301, an accumulator 310 and a logic circuit 320. Pre-processing module 301 receives a codeword and is configured to partition the codeword into an appropriate format. In an embodiment, pre-processing module 301 receives a 255 byte codeword and partitions the codeword into 16 groups of 16 bytes. In another embodiment, the codeword is partitioned into groups of 8-bytes. Pre-processing module 301 is coupled to accumulator 310.

Accumulator 310 is configured to hold either 16 bytes or 8-bytes at a time. In an embodiment, accumulator 310 initially holds bits of a fixed value, such as zero bits. In another embodiment, accumulator 310 initially holds one group of 16 bytes from the 255 byte codeword. That is, initially a 16 byte portion of the codeword is loaded from pre-processing module 310 into accumulator 310.

Logic circuit 320 is coupled to pre-processing module 301 and accumulator 310. Logic circuit 310 is configured to iteratively compute a new bit for each bit held in accumulator 310, such that after a last iteration of the computation the bits held in accumulator 310 correspond to the fixed number of parity bytes of the codeword. In an embodiment in which the codeword is divided into 16 groups, the number of iterations is equal to 15—each iteration corresponding to one of the 15 groups of the codeword not initially loaded into accumulator 310.

As described in detail below, for each bit held in the accumulator, each iteration of the computation includes computing an exclusive-OR of a fixed subset of bits held in accumulator 310. In an embodiment, the exclusive-OR is computed for the fixed subset of bits held in accumulator 310 and an input bit from a respective group of bytes of the codeword, wherein the respective group corresponds to a respective iteration of the computation. For each bit held in accumulator 310, the fixed subset of bits included in the exclusive-OR is determined based on a primitive polynomial of the Galois field used in the computation of the RS parity bytes. The mathematical details for decomposing the codeword into groups of bytes and for determining the fixed subset for each bit is now described.

B. An Example Computation of 16 Parity Bytes in Accordance With an Embodiment of the Present Invention In an embodiment, the codeword may be 255 bytes wide, wherein each byte comprises 8-bits. Initially, the least significant 16 bytes of the codeword contain "junk" bits that do not correspond to the RS parity bytes. First, the codeword is divided into 16 groups of 16 bytes. Then, for each group of 16 bytes, first RS computation module 210 iteratively computes a new set of 16 bytes. After a last iteration, first RS computation module 210 outputs the 16 RS parity bytes. A detailed mathematical description of the decomposition of the 255 byte codeword and the iterative computation of the 16 RS parity bytes is included below.

The polynomial t(x) given in equation (1) represents the 255 bytes of the codeword. The coefficients $t_0, t_1, \ldots, t_{255}$ can be partitioned into 16 groups of 16 bytes in accordance with the following mathematical definition:

$$T_j(x) = \sum_{i=0}^{15} t_{16j+i} x^{15-i}. \tag{8}$$

Based on the partitioning given in equation (8), the polynomial t(x) can be rewritten as follows:

$$t(x) = \tag{9}$$
$$(((((((((((((((T_0(x)x^{16} + T_1(x))x^{16} + T_2(x))x^{16} + T_3(x))x^{16} + T_4(x))x^{16} +$$
$$T_5(x))x^{16} + T_6(x))x^{16} + T_7(x))x^{16} +$$
$$T_8(x))x^{16} + T_9(x))x^{16} + T_{10}(x))$$
$$x^{16} + T_{11}(x))x^{16} + T_{12}(x))x^{16} +$$
$$T_{13}(x))x^{16} + T_{14}(x))x^{16} + T_{15}(x)$$

Equation (9) represents the decomposition of the 255 byte codeword into 16 groups of 16 bytes. That is, each of the $T_j(x)$ represents a 16 byte portion of the 255 byte codeword.

To determine which bits are included in the exclusive-OR operation of each iteration of logic circuit 320 two additional mathematical definitions are given. First, a function M that operates on a polynomial is defined as follows:

$$M(f(x)) = (f(x) \cdot x^{16}) \bmod G(x). \tag{10}$$

From the partitioning of the polynomial t(x) given in equation (9) and the definition of the function M given in equation (10), the polynomial U(x) given in equation (6) can be rewritten as follows:

$$U(x) = \tag{11}$$
$$M(M(M(M(M(M(M(M(M(M(M(M(M(M(M(T_0(x)) + T_1(x)) +$$
$$T_2(x)) + T_3(x)) + T_4(x)) + T_5(x)) +$$
$$T_6(x)) + T_7(x)) + T_8(x)) +$$
$$T_9(x)) + T_{10}(x)) + T_{11}(x)) +$$
$$T_{12}(x)) + T_{13}(x)) + T_{14}(x)) + T_{15}(x)$$

In each occurrence of M in equation (11), it acts on a polynomial of order less than or equal to 15, and produces a different polynomial of order less than or equal to 15.

Second, a set of functions $G_j(x)$ is defined as follows:

$$G_j(x) = x^{31-j} \bmod G(x) \tag{12}$$
$$= \sum_{j=0}^{15} G_{i,j} x^{15-j}.$$

Then, for a generic function $f(x)$ given by $$f(x) = \sum_{i=0}^{15} f_i x^{15-i}, \tag{13}$$

the expression $f'(x) = M(f(x))$ can be represented in matrix form as:

$$\begin{pmatrix} f'_0 \\ f'_1 \\ \vdots \\ f'_{15} \end{pmatrix} = \begin{pmatrix} G_{0,0} & G_{1,0} & \cdots & G_{15,0} \\ G_{0,1} & G_{1,1} & \cdots & G_{15,1} \\ \vdots & \vdots & \ddots & \vdots \\ G_{0,15} & G_{1,15} & \cdots & G_{15,15} \end{pmatrix} \begin{pmatrix} f_0 \\ f_1 \\ \vdots \\ f_{15} \end{pmatrix} \tag{14}$$

where the matrix multiplication is performed by Galois field multiplication and addition.

The generic matrix form shown in equation (14) can be used to iteratively compute the polynomial U(x) given in equation (11). To illustrate how equation (14) can be used to compute the polynomial U(x), equation (11) can be recast as a set of equations given as $$U_0(x) = T_0(x) \tag{15}$$
$$U_1(x) = M(T_0(x)) + T_1(x)$$

-continued
$$U_2(x) = M[M(T_0(x)) + T_1(x)] + T_2(x) = M(U_1(x)) + T_2(x)$$
$$\vdots$$
$$U_{15}(x) = M(U_{14}(x)) + T_{15}(x) = U(x),$$

wherein $$U_i = \sum_{j=0}^{15} U_{i,j} x^{15-j}$$

and the coefficients of $U_{15}(x)$ are equal to the coefficients of $U(x)$.

Using the decomposition shown in equation (15), the matrix form shown in equation (14) can be used, for example, to compute $U_1(x)$ as follows:

$$\begin{pmatrix} U_{1,0} \\ U_{1,1} \\ \vdots \\ U_{1,15} \end{pmatrix} = \begin{pmatrix} G_{0,0} & G_{1,0} & \cdots & G_{15,0} \\ G_{0,1} & G_{1,1} & \cdots & G_{15,1} \\ \vdots & \vdots & \ddots & \vdots \\ G_{0,15} & G_{1,15} & \cdots & G_{15,15} \end{pmatrix} \begin{pmatrix} U_{0,0} \\ U_{0,1} \\ \vdots \\ U_{0,15} \end{pmatrix} + \begin{pmatrix} t_{16} \\ t_{17} \\ \vdots \\ t_{31} \end{pmatrix} \quad (16)$$

In this way, the polynomial $U(x)$ can be computed by repeatedly performing a calculation analogous to equation (16) for each of the $U_i$ shown in equation (15). That is, equation (16) can be generalized as follows for each $U_i$ for $i=1, \ldots, 15$:

$$\begin{pmatrix} U_{i,0} \\ U_{i,1} \\ \vdots \\ U_{i,15} \end{pmatrix} = \begin{pmatrix} G_{0,0} & G_{1,0} & \cdots & G_{15,0} \\ G_{0,1} & G_{1,1} & \cdots & G_{15,1} \\ \vdots & \vdots & \ddots & \vdots \\ G_{0,15} & G_{1,15} & \cdots & G_{15,15} \end{pmatrix} \begin{pmatrix} U_{i-1,0} \\ U_{i-1,1} \\ \vdots \\ U_{i-1,15} \end{pmatrix} + \begin{pmatrix} t_{16i} \\ t_{16i+1} \\ \vdots \\ t_{16i+15} \end{pmatrix} \quad (17)$$

All the $G_{ij}$ in equation (17) are constant, and do not depend on the input vector (i.e., the $U_{i-1,j}$), nor on the number of parity bytes. In the Galois field, multiplication by constants, and addition, are both linear on a per-bit basis. Consequently, each of the input bits in $U_{i-1}$ has a fixed contribution to the set of output bits in $U_i$. Accordingly, the fixed contribution from the $U_{i-1}$ can be combined by an exclusive-OR operation to produce a result. Then, the contribution from the $t_{16i+j}$ can be added to the result to form the final output in $U_i$. Because addition modulo two is equivalent to an exclusive-OR, each output bit in $U_i$ consists of the exclusive-OR of the following bits: (i) a subset of the input bits in $U_{i-1}$ and (ii) input bits from $t_{16i+j}$.

Moreover, the particular subsets of input bits used do not depend on the data bytes of the codeword; rather the input bits only depend on the particular Galois field in use. That is, the subset of input bits of $U_{i-1}$ that contribute to the output bits $U_i$ are only dependent on the form of the matrix consisting of elements $G_{ij}$. Therefore, logic circuit 320 can be configured to perform the matrix multiplication of equation (17) by taking as input the fixed subset of bits of $U_{i-1}$ that contribute to the output bits of $U_i$. Mathematically, the fixed subset can be determined in the following way: for a given output bit corresponding to the coefficient of $U_i$ of $\alpha^{i'} x^{15-j'}$, the coefficient in $U_{i-1}$ of $\alpha^i x^{15-j}$ is fed into the exclusive-OR if and only if the coefficient of $\alpha^{i'}$ in $(G_{j,j'} \cdot \alpha^i)$ is non-zero. Consequently, each output bit $U_i$ is an exclusive-OR of the fixed subset of the bits $U_{i-1}$ plus the addition of input bits $t_{16i+j}$.

Figure 4:
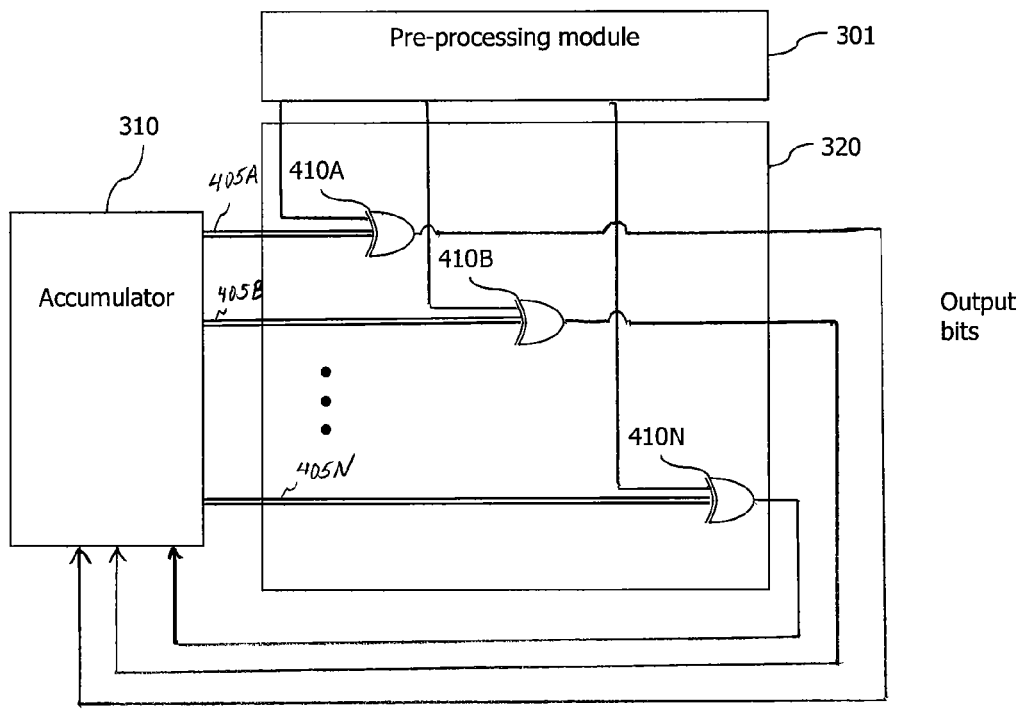
FIG. 4 depicts a block diagram illustrating a logic circuit included in the sub-module of FIG. 3.

FIG. 4 depicts a block diagram illustrating the operation of logic circuit 320.

As shown in FIG. 4, logic circuit 320 includes a plurality of exclusive-OR modules, including a first exclusive-OR module 410A, a second exclusive-OR module 410B through an Nth exclusive-OR module 410N, wherein N is an integer. The integer number N corresponds with the number of bits included in accumulator 310. Thus, there is an exclusive-OR module for each bit included in accumulator 310. In an embodiment, logic circuit 320 includes 128 exclusive-OR modules.

First exclusive-OR module 410A takes as input a first fixed subset of bits 405A from accumulator 310 and (optionally) receives a first bit from pre-processing module 301. Second exclusive-OR module 410B takes as input a second fixed subset of bits 405B from accumulator 310 and (optionally) receives a second bit from pre-processing module 301. Similarly, Nth exclusive-OR module 410N takes as input an Nth fixed subset of bits 405N from accumulator and (optionally) receives an Nth bit from pre-processing module 301. First fixed subset 405A, second fixed subset 405B, through Nth fixed subset 405N are each dependent on the GU as defined above.

Collectively, exclusive-OR modules 410 are configured to compute the matrix multiplication and addition shown in equation (17).

In an embodiment, logic circuit 320 includes 128 exclusive-OR modules, each of which takes input from a different subset of bits from accumulator 310 to produce a one bit output. In this embodiment, each one bit output from each of the 128 exclusive-OR modules is written back into a bit of the 128 bit accumulator.

In a microprocessor-based implementation, the RS parity bytes computed in accordance with repeated application of equation (17) can be realized by performing a PUTG and a MATG instruction. PUTG instruction can set a 128-bit accumulator ("acc"). The 128-bit accumulator can be similar to accumulator 310 and the accumulator can comprise the concatenation of two 64-bit general-purpose registers. MATG instruction can be defined to perform the operation:

acc:=$M$(acc)+in where "in" is formed from the concatenation of the two 64-bit registers, and the function M operates as defined in equation (10). The bit (i+8j) of the 128-bit accumulator is considered as the coefficient of $\alpha^i x^{15-j}$ in $U_{i-1}$.

Then, executing the following operations in order will result in the desired parity bytes:

PUTG $T_{0Lo}$, $T_{0Hi}$
MATG $T_{1Lo}$, $T_{1Hi}$
MATG $T_{2Lo}$, $T_{2Hi}$
MATG $T_{3Lo}$, $T_{3Hi}$
. . .
MATG $T_{15Lo}$, $T_{15Hi}$ where $T_{<n>Lo}$ contains $t_{8n+0}$ through $t_{8n+7}$ and $T_{<n>Hi}$ contains $t_{8n+8}$ through $t_{8n+15}$. At the completion of these instructions, the 128-bit 'acc' register forms the 128-bit polynomial $U(x)$ described above.

C. Another Example Computation of 16 Parity Bytes in Accordance With an Embodiment of the Present Invention In another embodiment, accumulator 310 is 16 bytes, but receives 8-bytes at a time, rather than 16 as in the previous subsection. Using 8-bytes at a time, rather than 16, reduces the complexity of operation, and hence silicon area, by about a factor of 2.

Mathematical details for implementing this embodiment are now presented. Data in accumulator 310 is represented by a U vector given by the following equation:

$$\begin{pmatrix} U_{0,0} \\ U_{0,1} \\ \vdots \\ U_{0,15} \end{pmatrix} = \begin{pmatrix} t_0 \\ t_1 \\ \vdots \\ t_{15} \end{pmatrix} \quad (18)$$

In the embodiment in which 16 bytes were fed into accumulator 310, the 16 parity bytes are computed in accordance with equation (17). In an analogous manner, when 8-bytes are fed into accumulator 310, the 16 parity bytes are computed in accordance with the following equation:

$$\begin{pmatrix} U_{i+1,0} \\ U_{i+1,1} \\ \vdots \\ U_{i+1,15} \end{pmatrix} = \begin{pmatrix} G_{0,0} & G_{1,0} & \cdots & G_{7,0} \\ G_{0,1} & G_{1,1} & \cdots & G_{7,1} \\ \vdots & \vdots & \ddots & \vdots \\ G_{0,15} & G_{1,15} & \cdots & G_{7,15} \end{pmatrix} \begin{pmatrix} U_{i,0} \\ U_{i,1} \\ \vdots \\ U_{i,7} \end{pmatrix} + \begin{pmatrix} U_{i,8} \\ \vdots \\ U_{i,15} \\ t_{8i+16} \\ \vdots \\ t_{8i+23} \end{pmatrix} \quad (19)$$

In this embodiment, input into accumulator 310 is split up into blocks of 8-bytes. The 8-byte blocks of data may be loaded into accumulator 310 in different manners. For example, in a microprocessor-based implementation, the first 2 sets of 8-bytes are fed into accumulator 310 using the following instruction: "PUTG first, second." In this example, subsequent blocks of 8-bytes are fed into accumulator 310 8-bytes at a time using the MATG instruction. As another example, the first 8-bytes may be loaded into accumulator 310 using "PUTG 0, first". Then, all subsequent blocks of 8-bytes, starting with the second block, may be fed into accumulator 310 using the MATG instruction. As a further example, accumulator 310 may initially contain all zeroes using "PUTG 0, 0". Then, all blocks of 8-bytes may be fed into accumulator 310 using the MATG instruction.

These examples are presented for illustrative purposes only, and not limitation. Other methods for loading blocks of data into an accumulator may be implemented without deviating from the spirit and scope of the present invention. Based on the description contained herein, a person skilled in the relevant art(s) will understand how to load blocks of data into an accumulator in different ways.

Equations (18) and (19)—which may be used to compute 16 parity bytes in 8-byte blocks—are similar to equations (15) and (17)—which were used to compute 16 parity bytes in 16-byte blocks, except the matrix $G_{i,j}$ in equation (19) is 8-by-16, instead of 16-by-16 as in equation (17). In addition, the column vector added after the multiplication consists of 8-bytes from accumulator 310 (represented by $U_{i,8}, \ldots, U_{i,15}$) and 8-bytes from the input codeword (represented by $t_{8i+16}, \ldots, t_{8i+23}$). Ultimately each bit in the new value of accumulator 310 (represented by column vector $U_{i+1,0}, \ldots, U_{i+1,15}$ in equation (19)) comprises an exclusive-OR of a subset of bits from the current accumulator (represented by $U_{i,0}, \ldots, U_{i,7}$), and optionally an exclusive-OR with a bit from the input codeword (represented by $t_{8i+16}, \ldots, t_{8i+23}$).

D. An Example Computation of 8 Parity Bytes in Accordance With an Embodiment of the Present Invention In a further embodiment, only 8-bytes of an accumulator are used. The accumulator in this embodiment may be accumulator 310 or may be a separate 8-byte accumulator. By using only 8-bytes, it is possible to reduce the silicon area of a microprocessor used to implement this embodiment.

Mathematical details for implementing this embodiment are now presented. Data in accumulator 310 is represented by a U vector given by the following equation:

$$\begin{pmatrix} U_{0,0} \\ U_{0,1} \\ \vdots \\ U_{0,7} \end{pmatrix} = \begin{pmatrix} t_0 \\ t_1 \\ \vdots \\ t_7 \end{pmatrix} \quad (20)$$

In an analogous manner to that described above, the 8 RS parity bytes are computed in accordance with the following equation:

$$\begin{pmatrix} U_{i+1,0} \\ U_{i+1,1} \\ \vdots \\ U_{i+1,7} \end{pmatrix} = \begin{pmatrix} H_{0,0} & H_{1,0} & \cdots & H_{7,0} \\ H_{0,1} & H_{1,1} & \cdots & H_{7,1} \\ \vdots & \vdots & \ddots & \vdots \\ H_{0,7} & H_{1,7} & \cdots & H_{7,7} \end{pmatrix} \begin{pmatrix} U_{i,0} \\ U_{i,1} \\ \vdots \\ U_{i,7} \end{pmatrix} + \begin{pmatrix} t_{8i+8} \\ t_{8i+9} \\ \vdots \\ t_{8i+15} \end{pmatrix} \quad (21)$$

As illustrated by equation (21), the computation of the RS parity bytes is performed in accordance with an 8-by-8 matrix, instead of an 8-by-16 matrix as in the previous embodiment. Similar to the previous embodiment, however, the Galois field multiplication comprises an exclusive-OR of a subset of the accumulator bits and a bit from the input codeword—which is not optional in this embodiment.

As in the 16-parity-byte embodiment, the bits may be loaded in the accumulator in different manners. For example, 8-bytes corresponding to the data word may be initially loaded into the accumulator. As another example, the accumulator may be initially set to contain a constant value, such as all zeroes. Then, subsequent blocks of 8-bytes may be fed into the accumulator.

III. Computation of a Programmable Number of Parity Bytes

As described above, first RS computation module 210 computes a fixed number of RS parity bytes, such as RS parity bytes corresponding to the polynomial U(x)=t(x)mod G(x), where the polynomial t(x) is given by equation (1) and the polynomial G(x) is given by equation (7). Second RS computation module 220 computes the polynomial u(x)=U(x) mod G(x), where the polynomial u(x) is dependent on R parity bytes and where R is less than 16. In other words, second RS computation module 220 computes a programmable number of parity bytes (R) from the fixed number of parity bytes computed by first RS computation module 210.

In order to simplify the concatenation of the parity bytes with the data bytes, second RS computation module 220 outputs a polynomial v(x) of the same order as U(x). The coefficients in v(x) of $x^0, x^1, \ldots, x^{R-1}$ are equal to the corresponding coefficients of u(x) and the coefficients in v(x) of $x^R, \ldots, x^{15}$ are equal to the corresponding coefficients of t(x). Consequently, the polynomial of v(x) can be stored forming the last 16 bytes of the concatenated codeword. In other words, a portion of the polynomial v(x) corresponds to the R parity bytes of the codeword computed by second RS computation module 220 and a portion of v(x) corresponds to data bytes of the codeword.

Second RS computation module 220 takes a single instruction of the form:

PRDG out0, out1, in0, in1 where in0 and in1 are two 64-bit registers containing the least-significant 16 bytes of t(x); and out0 and out1 are two 64-bit registers which are set to the value of v(x).

The instruction also takes as input the value of the 128-bit accumulator used by first RS computation module 210, which holds the polynomial U(x). The instruction also takes as input a value in a configuration register which determines the value of R—the number of parity bytes to be computed by second RS computation module 220.

Figure 5:
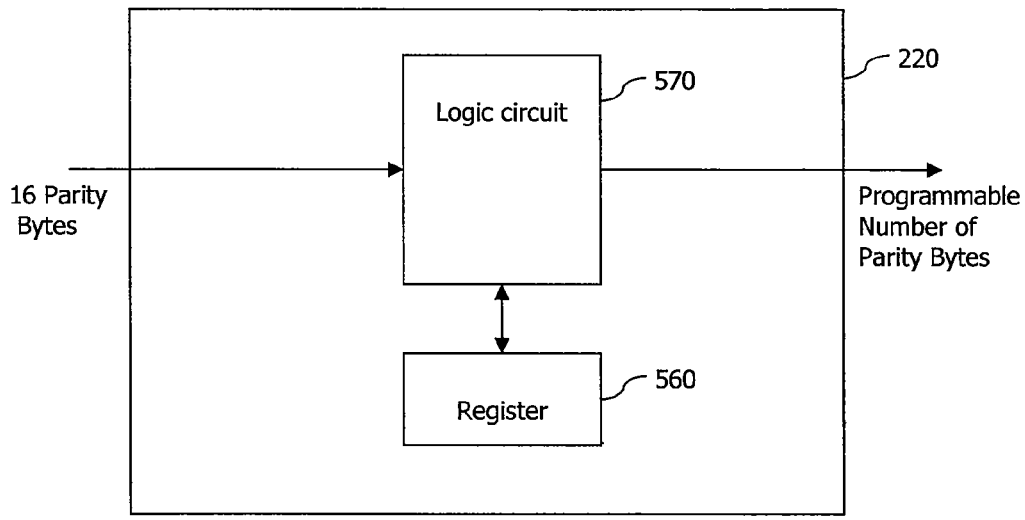
FIG. 5 illustrates a second of the sub-modules of FIG. 2 for computing Reed-Solomon parity bytes in accordance with an embodiment of the present invention.

For a given value of R, the value of each bit of each coefficient of u(x) is equal to an exclusive-OR of a fixed subset of the bits of the coefficients of U(x), in a similar manner to that described above with respect to first RS computation module 210. For example, FIG. 5 depicts a block diagram illustrating the operation of second RS computation module 220. As shown in FIG. 5, second RS computation module 220 includes a logic circuit 570 and a register 560. Logic circuit 570 is configured to compute the exclusive-OR of the fixed subset of the bits of the coefficients of U(x) for each valid value of R. Logic circuit 570 is similar to logic circuit 320 of first RS computation module 210. In fact, in an embodiment, logic circuit 570 and logic circuit 320 are combined into a single logic circuit. Register 560 stores a value corresponding to the number of parity bytes, R, to be computed by second RS computation module 220. Based on the value of R, logic circuit 570 is configured to select between a value computed from this exclusive-OR or a corresponding bit in t(x) as the final output bit of v(x).

The mathematical derivation for calculating the polynomial u(x) from the polynomial U(x) is now described. Let U(x) and g(x) be represented as $$U(x) = \sum_{j=0}^{ord(U)} U_j x^j, \quad (22)$$

and $$g(x) = x^R + \sum_{i=0}^{R-1} g_i x^i, \quad (23)$$

respectively.

Then, from equation (22) and (23), u(x) can be expressed as:

$$u(x) = \sum_{i=0}^{R-1} u_i x^i$$

$$= U(x) \bmod g(x)$$

$$= (U_{ord(U)} x^{ord(U)} + U_{ord(U)-1} x^{ord(U)-1} + \ldots + U_0)$$

$$\bmod(x^R + g_{R-1} x^{R-1} + \ldots + g_0)$$

By the properties of long division, each of the $u_i$ is a linear combination of the $U_j$ (whereas, the $g_i$ are constant for a given value of R). Consequently, the $u_i$ can be expressed in terms of the $U_j$ as follows $$u_i = \sum_{j=0}^{ord(U)} k_{i,j} U_j \quad (24)$$

for some constants $k_{i,j}$. It is to be appreciated that both the $k_{i,j}$ and the $U_j$ are elements of the Galois field.

If $f(\alpha)$ is the primitive polynomial for the Galois field, and the $U_j$ are expanded in terms of the coefficients of the polynomial in $\alpha$, then $$U_j = \sum_{m=0}^{7} U_{j,m} \alpha^m, \quad (25)$$

where ($U_{j,m}$=0 or 1, for all j, m).

Substituting equation (25) into equation (24) and manipulating yields the following results:

$$u_i = \sum_{j=0}^{ord(U)} \left( k_{i,j} \sum_{m=0}^{7} U_{j,m} \alpha^m \right)$$

$$= \sum_{j=0}^{ord(U)} \sum_{m=0}^{7} U_{j,m} ((k_{i,j} \alpha^m) \bmod f(\alpha))$$

$$= \sum_{j=0}^{ord(U)} \sum_{m=0}^{7} \left( U_{j,m} \sum_{n=0}^{7} k_{i,j,m,n} \alpha^n \right) \text{ (for some binary } k_{i,j,m,n})$$

$$= \sum_{j=0}^{ord(U)} \sum_{m=0}^{7} \sum_{n=0}^{7} U_{j,m} k_{i,j,m,n} \alpha^n$$

$$= \sum_{n=0}^{7} \left( \sum_{j=0}^{ord(U)} \sum_{m=0}^{7} U_{j,m} k_{i,j,m,n} \right) \alpha^n$$

Thus, each bit of $u_i$ is equal to the sum modulo two of a subset of the bits of the coefficients of U(x). As is well-known, summation modulo two is equivalent to the performance of an exclusive-OR.

IV. An Example Method

Figure 6:
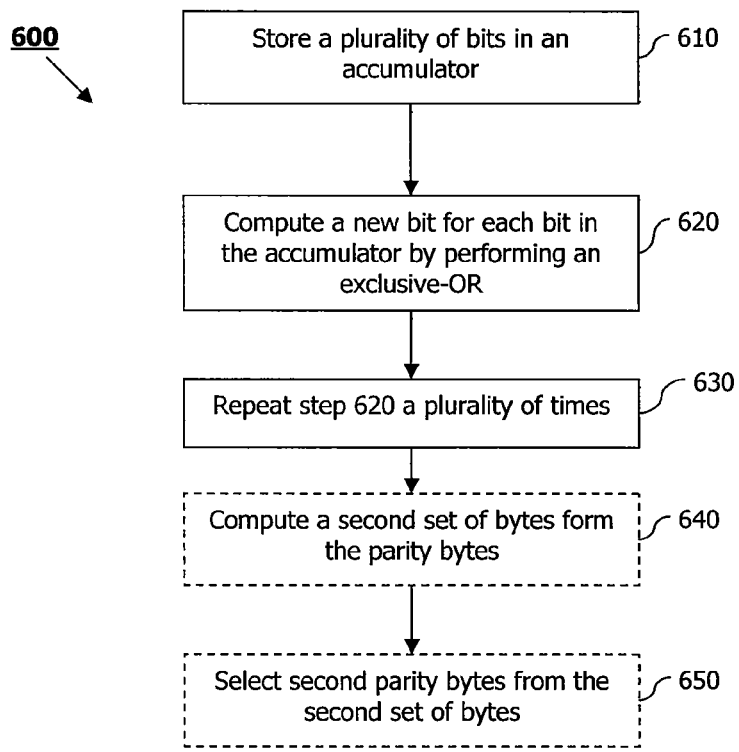
FIG. 6 depicts a flowchart illustrating a method for computing Reed-Solomon parity bytes in accordance with an embodiment of the present invention.

FIG. 6 depicts a flowchart 600 illustrating a method for calculating RS parity bytes of a codeword in accordance with an embodiment of the present invention. For example, the method illustrated in flowchart 600 can be implemented by RS computation module 100 of FIG. 1.

In a step 610, a plurality of bits are held in an accumulator. For example, the accumulator can be accumulator 310 of FIG. 3. Each bit held in the accumulator initially corresponds to a data bit associated with a data byte of a codeword. For example, the accumulator can initially hold a 16 byte portion of a 255 byte codeword, as described above. In this example, the 255 byte codeword is partitioned into 16 groups of 16 bytes.

In a step 620, a new bit is computed for each bit held in the accumulator by performing for each bit an exclusive-OR of the following bits: (i) a fixed subset of the bits held in the accumulator and (ii) an input bit of the codeword. The fixed subset is determined based on a primitive polynomial of a Galois field, as described above.

In a step 630, step 620 is repeated a plurality of times, such that after a last repetition the bits held in the accumulator correspond to the parity bytes. In an embodiment in which the codeword comprises 255 bytes, step 620 is repeated 15 times.

Flowchart 600 can optionally include a step 640 and a step 650 for computing a programmable number of parity bytes.

In optional step 640, a second set of bytes is computed from the parity bytes resulting after step 630, wherein each bit in the second set of bytes is computed by performing an exclusive-OR of a second fixed subset of the bits of the parity bytes.

The second fixed subset is determined based on the primitive polynomial of the Galois field, as described above.

In optional step 650, second parity bytes are selected from the second plurality of bytes computed in optional step 640, wherein the second parity bytes comprise fewer bytes than the parity bytes resulting after step 630.

V. Example Computer System Implementation

As mentioned above, various aspects of the present invention can be implemented by software, firmware, hardware, or a combination thereof. For example, the PUTG, MATG and PRDG instructions described above can be recorded on a computer readable medium described below. These instructions could then be implemented on a microprocessor.

Figure 7:
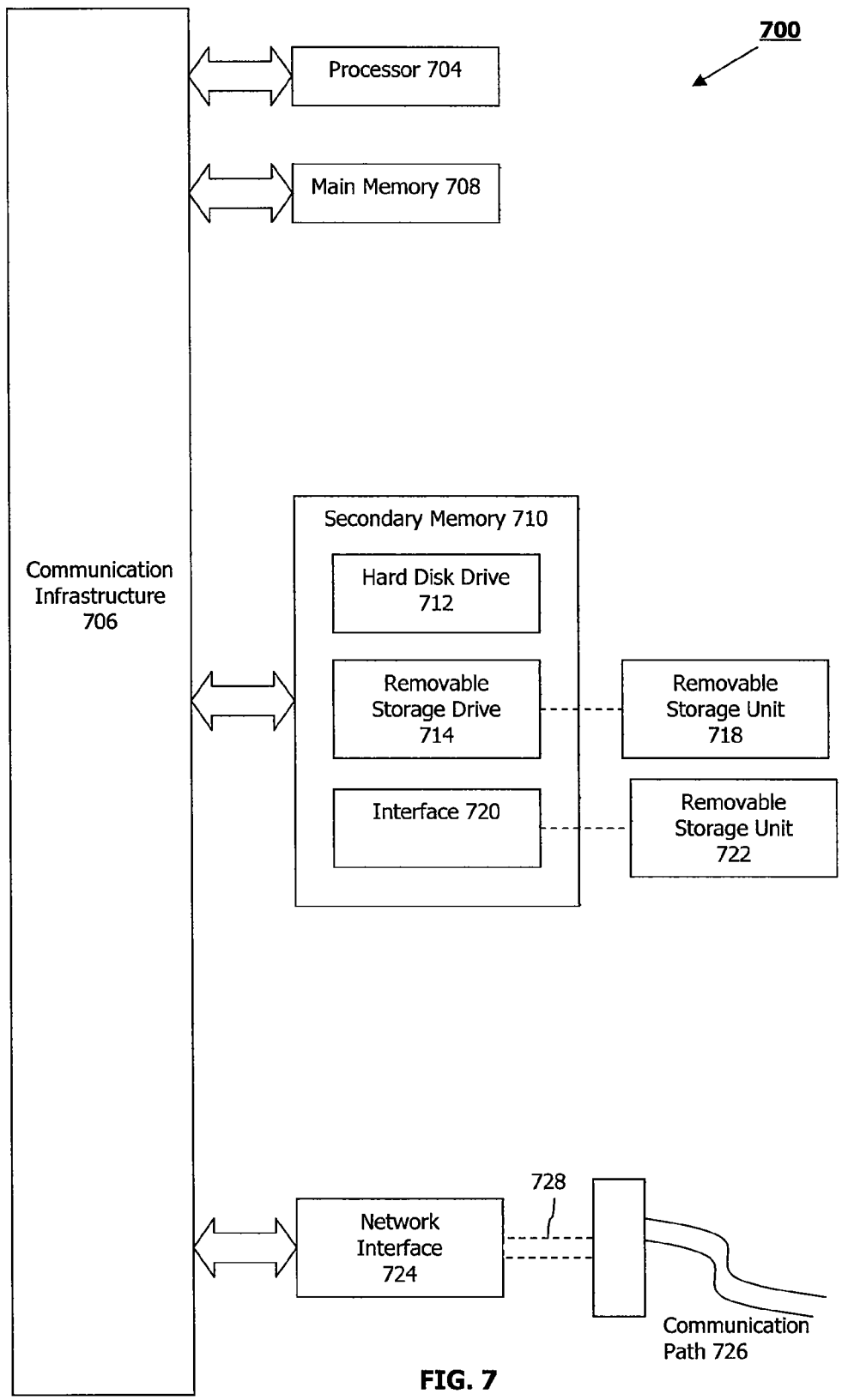
FIG. 7 is a block diagram of a computer system on which an embodiment of the present invention may be executed.

FIG. 7 illustrates an example computer system 700 in which an embodiment of the present invention, or portions thereof, can be implemented as computer-readable code. For example, the method illustrated by flowchart 600 of FIG. 6 or the PUTG, MATG and PRDG instructions can be implemented in system 700. Various embodiments of the invention are described in terms of this example computer system 700. After reading this description, it will become apparent to a person skilled in the relevant art how to implement the invention using other computer systems and/or computer architectures.

Computer system 700 includes one or more processors, such as processor 704. Processor 704 can be a special purpose or a general purpose processor. For example, processor 704 can include RS computation module 100 for computing RS parity bytes of a codeword. Processor 704 is connected to a communication infrastructure 706 (for example, a bus or network).

Computer system 700 also includes a main memory 708, preferably random access memory (RAM), and may also include a secondary memory 710. Secondary memory 710 may include, for example, a hard disk drive 712 and/or a removable storage drive 714. Removable storage drive 714 may comprise a floppy disk drive, a magnetic tape drive, an optical disk drive, a flash memory, or the like. The removable storage drive 714 reads from and/or writes to a removable storage unit 718 in a well known manner. Removable storage unit 718 may comprise a floppy disk, magnetic tape, optical disk, etc. which is read by and written to by removable storage drive 714. As will be appreciated by persons skilled in the relevant art(s), removable storage unit 718 includes a computer usable storage medium having stored therein computer software and/or data.

In an embodiment, the only memory included in computer system 700 is main memory 708. Such an embodiment may be realized, for example, in a situation in which computer system 700 is a deeply-embedded system. However, the present invention is not limited to this embodiment. For example, even in an embodiment in which computer system 700 is a deeply-embedded system, computer system 700 may include secondary memory 710, as would be apparent to a person skilled in the relevant art(s).

In an implementation, secondary memory 710 may include other similar means for allowing computer programs or other instructions to be loaded into computer system 700. Such means may include, for example, a removable storage unit 722 and an interface 720. Examples of such means may include a program cartridge and cartridge interface (such as that found in video game devices), a removable memory chip (such as an EPROM, or PROM) and associated socket, and other removable storage units 722 and interfaces 720 which allow software and data to be transferred from the removable storage unit 722 to computer system 700.

Computer system 700 may also include a communications interface 724. Communications interface 724 allows software and data to be transferred between computer system 700 and external devices. Communications interface 724 may include a modem, a network interface (such as an Ethernet card), a communications port, a PCMCIA slot and card, or the like. Software and data transferred via communications interface 724 are in the form of signals 728 which may be electronic, electromagnetic, optical, or other signals capable of being received by communications interface 724. These signals 728 are provided to communications interface 724 via a communications path 726. Communications path 726 carries signals 728 and may be implemented using wire or cable, fiber optics, a phone line, a cellular phone link, an RF link or other communications channels.

In this document, the terms "computer program medium" and "computer usable medium" are used to generally refer to media such as removable storage unit 718, removable storage unit 722, a hard disk installed in hard disk drive 712, and signals 728. Computer program medium and computer usable medium can also refer to memories, such as main memory 708 and secondary memory 710, which can be memory semiconductors (e.g. DRAMs, etc.). These computer program products are means for providing software to computer system 700.

Computer programs (also called computer control logic) are stored in main memory 708 and/or secondary memory 710. Computer programs may also be received via communications interface 724. Such computer programs, when executed, enable computer system 700 to implement the present invention as discussed herein. In particular, the computer programs, when executed, enable processor 704 to implement the processes of an embodiment of the present invention, such as the steps in the methods illustrated by flowchart 600 of FIG. 6 discussed above. Accordingly, such computer programs represent controllers of the computer system 700. Where the invention is implemented using software, the software may be stored in a computer program product and loaded into computer system 700 using removable storage drive 714, interface 720, hard drive 712 or communications interface 724. For example, the software may be loaded from a PROM included in interface 720 or from a network through communication interface 724.

The invention is also directed to computer products comprising software stored on any computer useable medium. Such software causes the enablement of the functions or fabrication, or both, of the systems and techniques disclosed herein. For example, this can be accomplished through the use of general programming languages (e.g., C, C++), hardware description languages (HDL) including Verilog HDL, VHDL, AHDL (Altera HDL), etc., or other available programming and/or circuit (e.g., schematic) capture tools. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

It is understood that the functions accomplished and/or structure provided by the systems and techniques described above can be represented in a core (e.g., a microprocessor core) that is embodied in program code and may be transformed to hardware as part of the production of integrated circuits. Also, the systems and techniques may be embodied as a combination of hardware and software. Accordingly, other implementations are within the scope of the following claims.

VI. Conclusion

While various embodiments of the present invention have been described above, it should be understood that they have been presented by way of example only, and not limitation. It will be apparent to a person skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A system for implementing a Reed-Solomon computation of parity bytes of a codeword, comprising:
an accumulator configured to hold a plurality of bits; and
a logic circuit configured to iteratively compute a new bit for each bit held in the accumulator, such that after a last iteration of the computation the bits held in the accumulator correspond to the parity bytes, wherein for each bit held in the accumulator each iteration of the computation comprises computing an exclusive-OR of a fixed subset of bits held in the accumulator.

2. The system of claim 1, wherein the exclusive-OR is computed for the fixed subset of bits held in the accumulator and an input bit of the codeword.

3. The system of claim 1, wherein each bit held in the accumulator initially corresponds to a bit associated with a data byte of the codeword.

4. The system of claim 1, wherein each bit held in the accumulator initially has a zero value.

5. The system of claim 1, wherein the logic circuit is configured to compute the exclusive-OR based on a primitive polynomial of a Galois field.

6. The system of claim 1, further comprising:
a second logic circuit configured to compute a programmable number of parity bytes responsive to the parity bytes computed by the logic circuit.

7. The system of claim 6, wherein the second logic circuit is configured to compute the exclusive-OR based on a primitive polynomial of a Galois field.

8. The system of claim 6, further comprising:
a third logic circuit configured to select the programmable number of parity bytes computed by the second logic circuit.

9. The system of claim 8, further comprising:
a register configured to hold a value, wherein the third logic circuit is configured to select the programmable number of parity bytes based on the value.

10. A method for implementing a Reed-Solomon computation of parity bytes of a codeword, comprising:
holding a plurality of bits in an accumulator;
computing a new bit for each bit held in the accumulator by performing for each bit an exclusive-OR of a fixed subset of the bits held in the accumulator; and
repeating the computing step a plurality of times, such that after a last repetition the bits held in the accumulator correspond to the parity bytes.

11. The method of claim 10, wherein the computing step comprises:
computing a new bit for each bit held in the accumulator by performing for each bit an exclusive-OR of the following bits: (i) a fixed subset of the bits held in the accumulator and (ii) an input bit of the codeword.

12. The method of claim 10, wherein the holding step comprises:
holding a plurality of bits in an accumulator, the plurality of bits corresponding to a data byte of the codeword.

13. The method of claim 10, wherein the holding step comprises:
holding a plurality of zero bits in an accumulator.

14. The method of claim 10, wherein the computing step comprises:
computing a new bit for each bit held in the accumulator by performing for each bit an exclusive-OR of a fixed subset of the bits held in the accumulator, wherein for each bit the fixed subset is based on a primitive polynomial of a Galois field.

15. The method of claim 10, further comprising:
computing a programmable number of parity bytes responsive to the parity bytes.

16. The method of claim 15, wherein computing a programmable number of parity bytes responsive to the parity bytes comprises:
computing for each bit of the parity bytes an exclusive-OR of a second fixed subset of the bits of the parity bytes.

17. The method of claim 16, wherein computing a programmable number of parity bytes responsive to the parity bytes comprises:
computing for each bit of the parity bytes an exclusive-OR of a second fixed subset of the bits of the parity bytes based on a primitive polynomial of a Galois field.

18. The method of claim 15, comprising:
computing fewer parity bytes responsive to the parity bytes.

19. The method of claim 18, further comprising:
computing fewer parity bytes responsive to the parity bytes, wherein a number of fewer parity bytes computed is based on a value held in a register.

20. A non-transitory computer-readable tangible medium comprising a microprocessor embodied in software, the microprocessor including:
an accumulator configured to hold a plurality of bits; and
a logic circuit configured to iteratively compute a new bit for each bit held in the accumulator, such that after a last iteration of the computation the bits held in the accumulator correspond to the parity bytes, wherein for each bit held in the accumulator each iteration of the computation comprises computing an exclusive-OR of a fixed subset of bits held in the accumulator.

21. The computer readable medium of claim 20, wherein the exclusive-OR is computed for the fixed subset of bits held in the accumulator and an input bit of the code word.

22. The computer readable medium of claim 20, wherein the microprocessor is embodied in hardware description language software.

23. The computer readable medium of claim 22, wherein the microprocessor is embodied in one of Verilog hardware description language software and VHDL hardware description language software.

* * * * *